US009651367B2

(12) United States Patent
Akita

(10) Patent No.: US 9,651,367 B2
(45) Date of Patent: May 16, 2017

(54) CURVATURE MEASURING IN A SUBSTRATE PROCESSING APPARATUS

(71) Applicant: NUFLARE TECHNOLOGY, INC., Kanagawa-ken (JP)

(72) Inventor: Masato Akita, Kawasaki (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 14/856,924

(22) Filed: Sep. 17, 2015

(65) Prior Publication Data

US 2016/0084641 A1 Mar. 24, 2016

(30) Foreign Application Priority Data

Sep. 24, 2014 (JP) ................................ 2014-193431

(51) Int. Cl.
*G01B 11/24* (2006.01)
*H01L 21/66* (2006.01)

(52) U.S. Cl.
CPC .............. *G01B 11/24* (2013.01); *H01L 22/12* (2013.01)

(58) Field of Classification Search
CPC ................................ G01B 11/24; G01B 11/30
USPC .......................................................... 356/601
See application file for complete search history.

(56) References Cited

U.S. PATENT DOCUMENTS 5,912,738 A * 6/1999 Chason ................ G01B 11/255 356/601
7,505,150 B2 * 3/2009 Zettler ................... G01B 11/24 356/601
8,810,798 B2 * 8/2014 Zettler ................. G01B 11/255 356/601
2013/0021610 A1 1/2013 Kaspari
2015/0276388 A1 * 10/2015 Akita ..................... G01B 11/24 356/364

FOREIGN PATENT DOCUMENTS

JP 2011246749 A2 12/2011

* cited by examiner

*Primary Examiner* — Roy M Punnoose
(74) *Attorney, Agent, or Firm* — Rankin, Hill & Clark LLP

(57) ABSTRACT

A substrate processing apparatus has a process chamber, a long-shaped window on a wall surface of the process chamber, an irradiator configured to irradiate a first laser beam and a second laser beam to a substrate in the process chamber via the long-shaped window so that incident points of the first and second laser beams are aligned substantially along a long side direction of the window, a detector configured to have a light reception surface receiving the first and second laser beams reflected by the substrate and passing through the window, the detector being configured to detect incident positions of the first and second laser beams on the light reception surface, and a calculator configured to calculate a curvature of the substrate by using a relative position of the first laser beam and the second laser beam which are detected by the detector.

10 Claims, 3 Drawing Sheets

10c
10
10a
L2
L1
10b
M1
A1
A2
2a
W

CURVATURE MEASURING IN A SUBSTRATE PROCESSING APPARATUS

CROSS REFERENCE TO RELATED APPLICATIONS

This application is based upon and claims the benefit of priority from the prior Japanese Patent Application No. 2014-193431, filed on Sep. 24, 2014, the entire contents of which are incorporated herein by reference.

FIELD

Embodiments according to the present invention relate to a substrate processing apparatus.

BACKGROUND

Conventionally, in the manufacturing process of a semiconductor device which requires a crystal film with a relatively large thickness as does a power device such as IGBT (Insulated Gate Bipolar Transistor), an epitaxial growth technique has been used which is to form a film by vapor-depositing a monocrystal thin film on a substrate such as a semiconductor wafer. A film forming apparatus used for the epitaxial growth technique is one example of a substrate processing apparatus, and in this film forming apparatus, a substrate such as a wafer is placed in a film forming chamber maintained at a normal pressure or a reduced pressure. Then, while this substrate is heated, gases as materials for film formation (material gases) are supplied into the film forming chamber. This causes thermal decomposition reaction and hydrogen reduction reaction of the material gases on a surface of the substrate, depositing an epitaxial film on the substrate.

In the film forming apparatus, a curvature measuring device (warp measuring device) is used for measuring the curvature of a substrate as an object to be measured. This curvature measuring device is mainly used for optimizing a process procedure or the like but is now used also in mass-production apparatuses, and constant warping monitoring is required increasingly. For example, during film formation of a gallium nitride (GaN) on an 8-inch silicon, monitoring of the degree of warping of a wafer during the film formation is quite important because of the presence of film forming conditions over a large temperature range in addition to a difference in thermal expansion coefficients and a large mismatch of crystal lattice constants between silicon and a GaN thin film. Neglecting this warp monitoring leads to decrease in product quality due to occurrence of breakage of the wafer or minute cracks in the thin film during film formation. Therefore, the warp monitoring is essential for optimization of a process procedure in advance of mass production but is also becoming necessary for keeping quality in mass-production situations where the state inside a film forming furnace changes little by little.

A currently common curvature measuring device irradiates two laser beams in parallel to a substrate via a window of the film forming chamber, detects the positions of two laser beams reflected by the substrate and returned via the window, reads the interval between them (incident position interval between the two laser beams), and converts it into the curvature of the substrate. As a method of detecting the laser beams at this moment, a 2-point CCD method is employed which is to detect two laser beams at once by a two-dimensional CCD (Charge-Coupled Device). Incidentally, the window passed by the laser beams is formed in a long shape extending in a diametrical direction of the substrate in the film forming chamber, in order to optically measure warp, temperature, and/or the like of the substrate. This window is called a view port, and for example, quartz is used as the material of the window.

However, the temperature in the film forming chamber becomes, for example, as high as about 1000° C. during film formation, and thus the window of the film forming chamber is exposed to high temperatures. At this moment, a large temperature difference occurs between the vicinity of edges of the window in contact with a wall of the film forming chamber and the center of the window, and thus a temperature gradient occurs in a short side direction of the long-shaped window. The refractive index of the window varies along the short side direction due to this temperature gradient in the short side direction. For example, while the refractive index of quartz increases as the temperature rises, temperature dependence of the refractive index varies depending on the material of the window, and thus the refractive index can become low as the temperature rises.

Therefore, when the incident points of the two laser beams on the window are aligned in parallel in the short side direction of the window, if a temperature gradient occurs in the short side direction of the window during film formation, the refractive indexes at these two incident points are different, and thus the incident position interval between the two laser beams varies due to the difference in the refractive indexes. That is, the incident position interval between the two laser beams varies due to a factor other than warping of the substrate, resulting in decreased accuracy of the curvature measurement.

An object to be solved by embodiments of the present invention is to provide a substrate processing apparatus capable of improving curvature measurement accuracy when the curvature of a substrate being processed is measured.

SUMMARY

According to an aspect of the present invention, a substrate processing apparatus includes:

a process chamber into which a substrate to be processed is loaded;

a long-shaped window provided on the process chamber;

an irradiator provided outside the process chamber and the irradiator being configured to irradiate a first laser beam and a second laser beam to the substrate in the process chamber via the long-shaped window in a manner that an incident point of the first laser beam and an incident point of the second laser beam with respect to the window are aligned substantially along a long side direction of the window;

a detector configured to have a light reception surface receiving the first laser beam and the second laser beam which are reflected by the substrate and passing through the window, the detector being configured to detect incident positions of the first laser beam and the second laser beam on the light reception surface; and a calculator configured to calculate a curvature of the substrate by using a relative position of the first laser beam and the second laser beam which are detected by the detector.

DETAILED DESCRIPTION

Embodiments will now be explained with reference to the accompanying drawings. The present invention is not limited to the embodiments.

First Embodiment

A first embodiment will be explained with reference to FIG. 1 to FIG. 4. Note that in the first embodiment a film forming apparatus will be explained as one example of a substrate processing apparatus.

Figure 1:
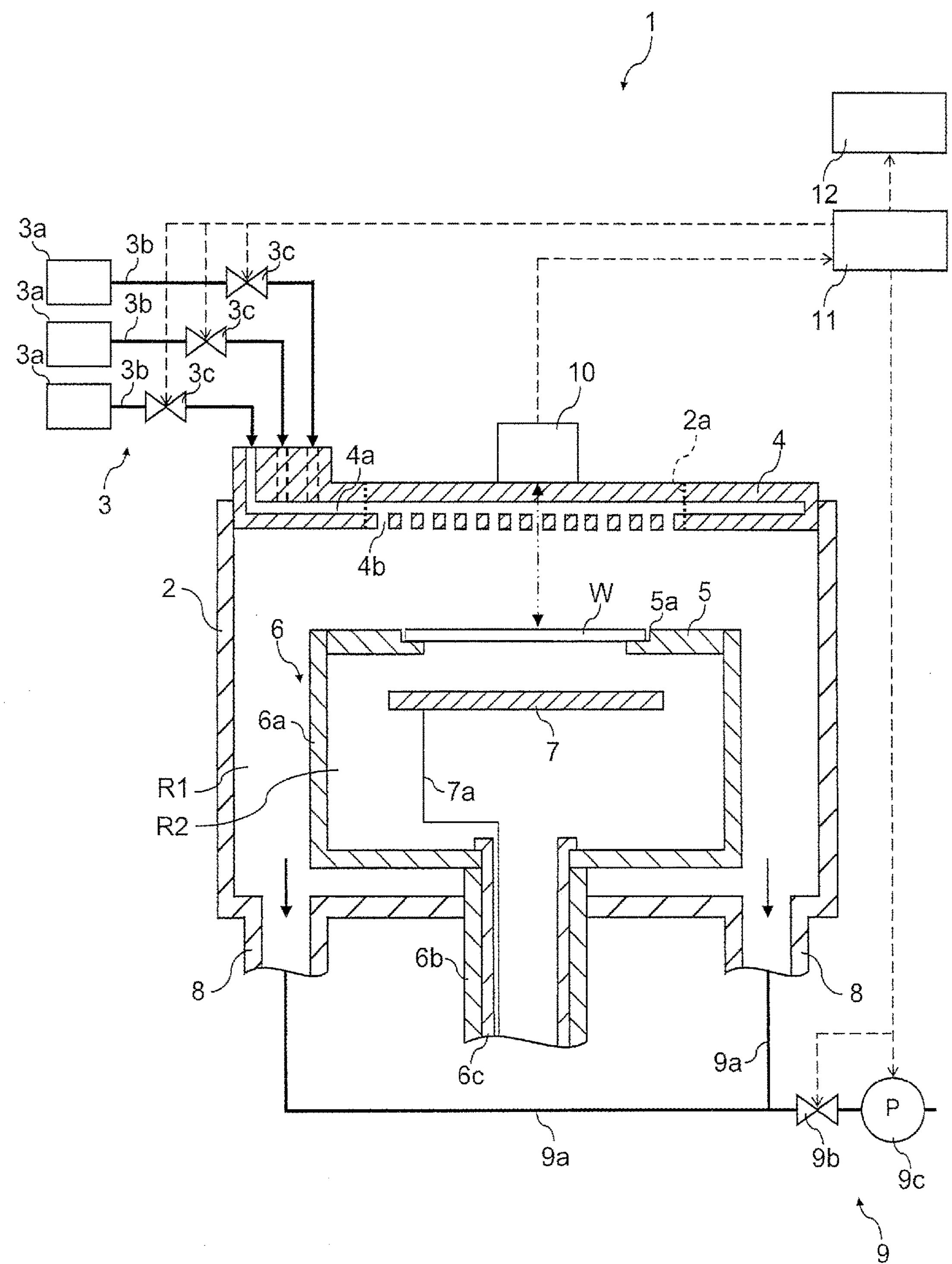
FIG. 1 is a diagram illustrating a schematic structure of a film forming apparatus according to a first embodiment.

As illustrated in FIG. 1, a film forming apparatus 1 according to the first embodiment has a chamber 2 as a film forming chamber in which film formation is performed on a substrate W, a gas supply part 3 supplying gases (material gases) to the substrate W in the chamber 2, a shower plate 4 located above the chamber 2, a susceptor 5 supporting the substrate W in the chamber 2, a rotating part 6 retaining the susceptor 5 and rotating, a heater 7 heating the substrate W, a plurality of gas exhaust parts 8 exhausting the gas in the chamber 2, an exhaust mechanism 9 exhausting the gas via the gas exhaust parts 8, a curvature measuring device 10 measuring a curvature (warp amount) of the substrate W, a control unit 11 controlling respective parts, and a notifier 12 giving a warning.

The chamber 2 is an example of a process chamber for processing the substrate W to be processed and functions as a film forming chamber (reaction chamber) for forming an epitaxial film by allowing vapor growth of a thin film on a surface of the substrate W (for example, a wafer of a semiconductor substrate). This chamber 2 is formed in a box shape of a cylindrical shape or the like, and the substrate W as a part to be processed and so on are accommodated therein.

The gas supply part 3 has a plurality of gas storage parts 3*a* storing gases separately, a plurality of gas pipes 3*b* connecting the gas storage parts 3*a* and the shower plate 4, and a plurality of gas valves 3*c* varying the flow rates of gases flowing through these gas storage parts 3*a*. These gas valves 3*c* are provided separately on respective gas pipes 3*b* and connected electrically to the control unit 11, and driving of them is controlled by the control unit 11.

The gas supply part 3 supplies material gases, for example three types of gases, for growing a crystal film on the surface of the substrate W by metalorganic chemical vapor deposition (MOCVD) or the like, into the chamber 2 via the shower plate 4. The three types of gases are stored in the respective gas storage parts 3*a*, these gases are supplied as material gases in a shower form from the shower plate 4 to the substrate W, thereby forming an epitaxial film on the substrate W. In addition, the types of the gases and the number of types of the gases are not particularly limited.

The shower plate 4 is provided above the chamber 2 and is formed in a plate shape having a predetermined thickness. This shower plate 4 has numerous gas supply flow paths 4*a* in which gases flow and numerous gas discharge ports (gas jetting ports) 4*b* leading to the gas supply flow paths 4*a*. These gas supply flow paths 4*a* and gas discharge ports 4*b* are formed as a structure capable of jetting gases in a shower form toward the substrate W in a state that the gases are separated without mixing plural types of gases (three types for example). In addition, the gases need not necessarily be supplied in a separated state, and may be supplied in a mixture.

This shower plate 4 adjusts the flows of gases for forming the epitaxial film, and supplies the gases in a shower form toward the surface of the substrate W via the gas discharge ports 4*b*. For example, a metal material such as stainless steel or aluminum alloy can be used as a material for the shower plate 4. Use of such a shower plate 4 can make the flows of the material gases be uniform in the chamber 2, enabling uniform supply of the material gases to the substrate W.

The susceptor 5 is provided above the rotating part 6, and is formed in an annular shape having an opening 5*a*. This susceptor 5 is structured such that a counterbore (annular recess) is provided in an inner peripheral side of the opening 5*a*, and an outer peripheral portion of the substrate W is accepted in this counterbore to be supported therein. Further, since it is exposed to high temperatures, the susceptor 5 is formed to withstand the temperatures. Although the structure in which the opening 5*a* is left as it is as described above is used as the structure of the susceptor 5, note that this is not restrictive. For example, a structure in which the opening 5*a* is blocked with a member can be used.

The rotating part 6 has a cylindrical part 6*a* retaining the susceptor 5, and a hollow rotor 6*b* as a rotation axis of the cylindrical part 6*a*. The cylindrical part 6*a* is structured so that its upper portion is open, and the susceptor 5 is disposed in an upper portion of the cylindrical part 6*a*. When the substrate W is mounted on this susceptor 5, the opening 5*a* of the susceptor 5 is covered, and a hollow area is formed. In this rotating part 6, as the rotor 6*b* is rotated by a rotation mechanism (not illustrated), the susceptor 5 rotates via the cylindrical part 6*a*. Accordingly, the substrate W on the susceptor 5 rotates as the susceptor 5 rotates.

The heater 7 is provided in the cylindrical part 6*a* and heats the substrate W from a lower surface (rear surface) of the substrate W on the susceptor 5. For example, a resistance heater can be used as the heater 7. The heater 7 is fed through a wire 7*a* passing through the inside of a substantially cylindrical shaft 6*c* made from quartz which is provided in the rotor 6*b*. This wire 7*a* is connected electrically to the control unit 11, and feeding of the heater 7 is controlled by the control unit 11.

Note that a raising and lowering pin and a raising and lowering device (both not illustrated) and the like are disposed as a substrate raising and lowering mechanism inside the shaft 6*c*. The raising and lowering device can raise or lower the raising and lowering pin, and the raising and lowering pin is used when the substrate W is carried into the chamber 2 or carried out of the chamber 2. At a time of carrying in, the raising and lowering pin moves to a transfer position where transfer of the substrate W with a carrier robot (not illustrated) takes place, and lowers to place the substrate W on the susceptor 5 after the transfer of the substrate W. Further, at a time of carrying out, the substrate W is lifted from below and moved away from the susceptor 5, and then moved to the aforementioned transfer position.

The gas exhaust parts 8 are exhaust ports for exhausting the material gases after reaction, and a plurality of them are provided in a lower portion of the chamber 2. These gas exhaust parts 8 are located and disposed in the circumference of the rotating part 6 in a bottom surface of the chamber 2, and are connected to the exhaust mechanism 9 exhausting gases.

The exhaust mechanism 9 has a plurality of gas exhaust flow paths 9*a* through which the material gases after reaction flow, an exhaust valve 9*b* varying the flow rates of the gases, and a vacuum pump 9*c* as a driving source for exhaustion. This exhaust mechanism 9 exhausts the material gases after reaction from the inside of the chamber 2 via the gas exhaust parts 8. The exhaust valve 9*b* and the vacuum pump 9*c* are connected electrically to the control unit 11, and driving of them is controlled by the control unit 11. Incidentally, the exhaust mechanism 9 is capable of adjusting the inside of the chamber 2 to a predetermined pressure under control by the control unit 11.

The curvature measuring device 10 is provided on an upper portion of the shower plate 4, and measures a curvature of the substrate W on the susceptor 5 by emitting and receiving two laser beams to and from the substrate W on the susceptor 5 (details of which will be described later). The laser beams are emitted and received through a position having light transparency located among the gas supply flow paths 4*a* of the shower plate 4, that is, a window 2*a* of the chamber 2. This curvature measuring device 10 is connected electrically to the control unit 11, and passes the measured curvature of the substrate W (curvature information) to the control unit 11.

The control unit 11 has, for example, a microcomputer having a processor centrally controlling the units and a storage device (both not illustrated) storing film forming process information related to a film forming process as well as various programs. In this control unit 11, the microcomputer executes arithmetic processing to control the gas supply part 3, the rotation mechanism of the rotating part 6, the exhaust mechanism 9, and so on based on the film forming process information and the various programs, so as to control supply of various gases from the gas supply part 3 via the shower plate 4 to the surface of the substrate W on the susceptor 5 rotating according to the rotation of the rotating part 6, heating of the substrate W by the heater 7, and the like. In addition, through the control of the gas supply part 3, it is possible to control respective operations of the gas valves 3*c* of the gas supply part 3 so as to adjust, for example, moments, periods of supply, and the like of the three types of gases. Incidentally, the control unit 11 can also be made of, for example, an application specific integrated circuit (ASIC), a circuit device such as a programmable logic device, or the like.

Further, the control unit 11 judges whether the curvature of the substrate W measured by the curvature measuring device 10 has reached a predetermined set value, and when judged that the curvature of the substrate W measured by the curvature measuring device 10 has reached the predetermined set value, the control unit 11 stops the film forming process and moreover outputs a notification instruction to the notifier 12. The set value is set in advance by a user or the like via an input unit (for example, an input device such as a keyboard or a mouse), and can be changed as necessary.

Upon reception of the notification instruction from the control unit 11, that is, when the curvature of the substrate W measured by the curvature measuring device 10 has reached the predetermined set value, the notifier 12 notifies (warns) the user that there is a problem in warping of the substrate W. One of various notifiers, for example an alarm such as a lamp or a buzzer, a display unit displaying texts and an audio output unit outputting a voice or sound, and the like can be used as this notifier 12.

The film forming apparatus 1 structured as such rotates the substrate W by rotation of the rotating part 6 and further heats the substrate W by the heater 7. Moreover, the shower plate 4 introduces the three types of material gases into the chamber 2, and supplies the three types of material gases toward the surface of the substrate W in a shower form, thereby forming a film by vapor deposition of an epitaxial film on the substrate W such as a wafer. The shower plate 4 supplies the three types of gases to the substrate W in the chamber 2 while keeping the gases separated without mixing.

Next, the above-described curvature measuring device 10 will be explained in detail with reference to FIG. 2 to FIG. 4.

Figure 2:
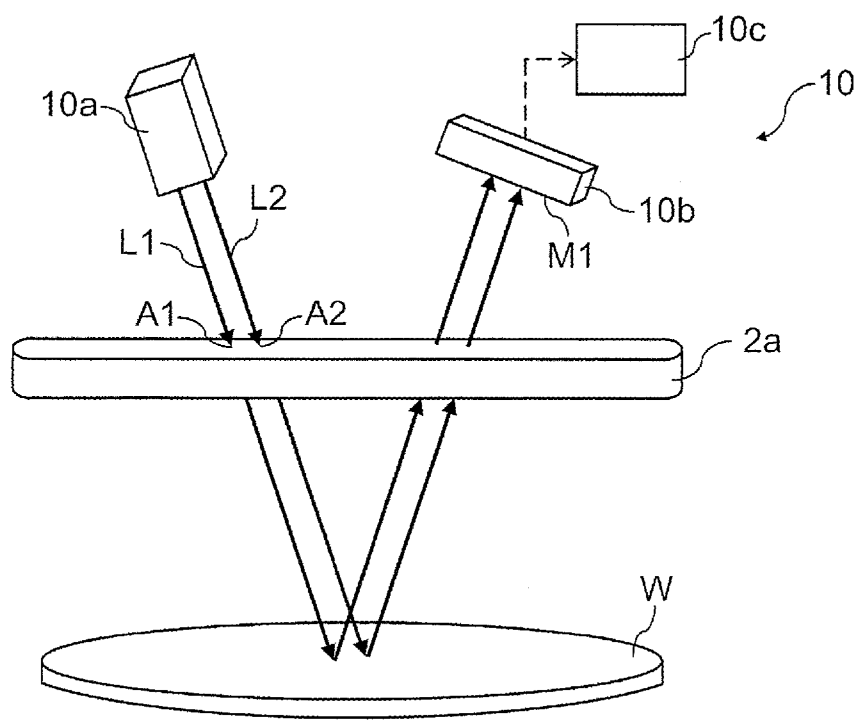
FIG. 2 is a diagram illustrating a schematic structure of a curvature measuring device according to the first embodiment.
Figure 3:
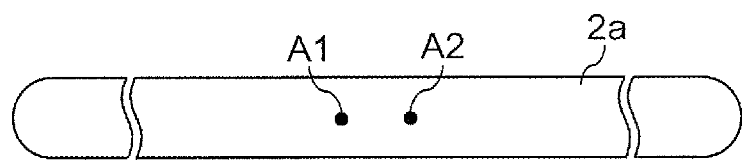
FIG. 3 is a plan view illustrating a window of a chamber and incident points of laser beams according to the first embodiment.

As illustrated in FIG. 2, the curvature measuring device 10 has an irradiator 10*a* irradiating two laser beams, namely, a first laser beam L1 and a second laser beam L2 in parallel via the window 2*a* of the chamber 2 to the substrate W as a processed object, a detector 10*b* detecting the first laser beam L1 and the second laser beam L2 which are reflected by the substrate W, and a calculator 10*c* calculating the curvature (warp amount) of the substrate W by using incident positions of both the first laser beam L1 and the second laser beam L2 which are detected by the detector 10*b*.

The window 2*a* is provided on an upper surface of the chamber 2 and is formed in a long shape extending in a diametrical direction of the substrate W in the chamber 2. The clearance between this window 2*a* and the substrate W is a distance of about 20 to 50 cm for example. One of various shapes, such as a slit shape or a rectangular shape, can be used as the shape of the window 2*a*. Further, the size of the window 2*a* is large enough that the first laser beam L1 and the second laser beam L2 can be emitted and received (for example, about a few cm or about few tens of cm at most). It is possible to use a light transmitting material, such as quartz or sapphire, as the material of the window 2*a*. Besides the warp measurement of the substrate W by the curvature measuring device 10, for example, this window 2*a* is used for optically measuring the temperature of the substrate W by a temperature measuring unit (for example a radiation thermometer). Further, the window 2*a* may also be used by another detection device, measuring device, or the like as necessary.

The irradiator 10*a* irradiates the first laser beam L1 and the second laser beam L2 in parallel to the substrate W through the window 2*a*. At this time, as illustrated in FIG. 3, the first laser beam L1 and the second laser beam L2 are irradiated so that incident points A1 and A2 in the long-shaped window 2*a* are substantially aligned along a long side direction of the window 2*a*. This irradiator 10*a* has, for example, a laser beam output unit, a beam splitter, a mirror, and/or the like (none of them are illustrated), separates a laser beam outputted from the laser beam output unit into the first laser beam L1 and the second laser beam L2 with the beam splitter, and makes the split laser beams be parallel by using the mirror. Note that the traveling directions of the laser beams L1 and L2 need not necessarily be strictly parallel, and just need to be substantially parallel. Further, the incident points A1 and A2 of the laser beams L1 and L2 to the substrate W are in the vicinity of the center of the substrate W, but are not particularly limited as long as it is possible to measure the curvature of the substrate W. Moreover, the point that the incident points A1 and A2 are substantially aligned along a long side direction of the window 2a means to include the cases where the incident points A1 and A2 of the first laser beam L1 and the second laser beam L2 are not strictly parallel in the long side direction of the window 2a, and means that the incident points A1 and A2 just need to be aligned substantially along the long side direction of the window 2a.

Figure 4:
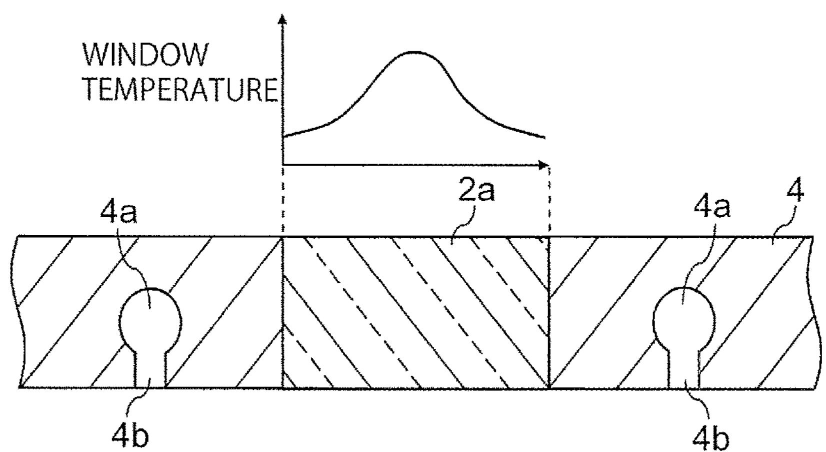
FIG. 4 is a cross-sectional view illustrating the window of the chamber and a shower plate according to the first embodiment.

Here, as illustrated in FIG. 4, a temperature gradient occurs in a short side direction of the window 2a during film formation. The temperature in the short side direction of the window 2a varies so as to increase toward the center from edges of the window 2a. This is because during film formation, the chamber 2 has a high temperature inside but gas flow paths such as the gas supply flow paths 4a and the gas discharge ports 4b are present in the shower plate 4 in the circumference of the window 2a, and the shower plate 4 is cooled to a certain extent by the flows of gases, making the temperatures on the edges of the window 2a be lower than in the center thereof.

This temperature difference in the short side direction of the window 2a causes the refractive index to change in the short side direction of the window 2a. Thus, in order to avoid the influence of a refractive index change in the short side direction of the window 2a, in this embodiment, the incident points A1 and A2 of both the first laser beam L1 and the second laser beam L2 are aligned substantially in parallel in the long side direction of the long-shaped window 2a. This is because in the long side direction of the window 2a, a temperature gradient does not occur and hence the refractive index does not change. Thus, when the incident points A1 and A2 of both the laser beams L1 and L2 are aligned substantially in parallel in the longitudinal direction of the window 2a, the refractive indexes in these positions become the same, and therefore, decrease in accuracy of the curvature measurement due to a difference in refractive index can be prevented. Note that here the longitudinal direction of the window 2a is in a direction to cross the short side direction, and in this embodiment, particularly the long side direction and the short side direction are in an orthogonal relation.

Desirably, for example, green laser beams (of 532 nm for example), which avoid the influence of emission of light (red-side light) from a red-hot substrate W and are highly sensitive for silicon detection systems, are used as the above-described laser beams L1 and L2. These green laser beams have a wavelength of, for example, between 500 nm or more and 540 nm or less (in the range of 500 to 540 nm), or is, by way of example, 532, 520, 514, 515, or 503 nm or the like, preferably 532 nm±5 nm.

Note that when the substrate W just becomes red hot, no problem would occur if at least green laser beams separated from red are used, because the intensity of laser beams are much stronger. However, when a film is made in the film forming apparatus 1, there occurs a moment that a reflection disappears due to interference between the film and the laser beams. When this occurs, the light of red heat becomes dominant, and the detector 10b may falsely judge the light of red heat as laser beams, which can decrease the positional detection accuracy. In order to prevent this, it is desirable to provide an optical filter (for example, a monochromatic filter) cutting (removing) lights having frequencies different from the frequencies of the above-described green laser beams.

Referring back to FIG. 2, the detector 10b has a light reception surface M1 receiving the first laser beam L1 and the second laser beam L2 which are reflected by the substrate W and have passed through the window 2a, and detects incident positions of both the laser beams L1 and L2 on this light reception surface M1. In practice, the detector 10b detects the incident positions of the laser beams L1 and L2, and thereby detects a displacement of the interval between the incident positions (incident position interval) of the two laser beams L1 and L2. For example, when a center of the substrate W warps upward, the incident position interval between the two laser beams L1 and L2 changes in a direction to increase, or conversely when the center of the substrate W warps downward, the incident position interval between the two laser beams L1 and L2 change in a direction to decrease.

For example, a one-dimensional or two-dimensional position detecting element can be used as the detector 10b. Further, irrespective of which of the position detecting elements is used, a CCD (Charge Coupled Device) or PSD (Position Sensitive Detector) or the like can be used. Note that the one-dimensional position detecting element has a plurality of light receiving elements aligned in one direction, and the two-dimensional position detecting element has pluralities of light receiving elements aligned in two directions, for example, in a lattice form. Either of the position detecting elements is provided so that one direction of alignment of light receiving elements is along the long side direction of the window 2a, but is not limited in particular.

The calculator 10c calculates the curvature (warp amount) of the substrate W by using the incident position of the first laser beam L1 and the incident position of the second laser beam L2 (relative positions) which are detected by the detector 10b. For example, the calculator 10c calculates a displacement amount of the incident position interval between the two laser beams L1 and L2 which is a separation distance between the incident position of the first laser beam L1 and the incident position of the second laser beam L2, and uses the calculated displacement amount to calculate the curvature of the substrate W. At this time, the curvature is calculated from the displacement amount by using an equation or a table expressing a correlation between the displacement amount and the curvature. However, for this calculation, various calculation methods can be used besides them. For example, when it is difficult to assume the radius of curvature before a displacement as infinite (plane), the calculated curvature can be taken as a curvature change amount and added to the known curvature before the displacement to correct it.

Here, when the detector 10b is the two-dimensional position detecting element, it is desirable to calculate the curvature of the substrate W by using a component in the long side direction (long side direction position) of the window 2a at the incident position of the first laser beam L1 and a component in the long side direction (long side direction position) of the window 2a at the incident position of the second laser beam L2. For example, when the laser beam L1 or L2 is shifted in the short side direction of the window 2a due to passing of the window 2a or reflection of the substrate W, the incident position of the laser beam L1 or L2 includes a component in the short side direction (short side direction position) of the window 2a, in addition to a component in the long side direction of the window 2a. If the incident position distance between the two laser beams L1 and L2 is calculated while this component in the short side direction of the window 2a is included, the incident position distance between these laser beams L1 and L2 will not be an accurate value, decreasing the curvature measurement accuracy. Accordingly, it is desirable to calculate the curvature of the substrate W by using only the component in the long side direction of the window 2*a* and excluding the component in the short side direction of the window 2*a*.

On the other hand, when the detector 10*b* is the one-dimensional position detection element, since the direction of alignment of the light receiving elements is along the long side direction of the window 2*a*, only a component in the long side direction of the window 2*a* at the incident position of the first laser beam L1 and a component in the long side direction of the window 2*a* at the incident position of the second laser beam L2 are detected even when the above-described variation of the laser beam L1 or L2 occurs in some degree. Consequently, the curvature of the substrate W is calculated by using these components only.

The curvature measuring device 10 with such a structure monitors warping of the substrate W in the above-described film forming step of an epitaxial film. In this warp monitoring, the first laser beam L1 and the second laser beam L2 are emitted by the irradiator 10*a* and proceed in parallel, and be incident on the surface of the substrate W after passing through the window 2*a*. At this moment, both the incident points A1 and A2 of the first laser beam L1 and the second laser beam L2 to the window 2*a* are aligned substantially in parallel in the long side direction of the window 2*a*.

Next, the first laser beam L1 and the second laser beam L2 specularly reflected by the substrate W pass through the window 2*a* in parallel and detected by the detector 10*b*. Thereafter, the calculator 10*c* uses the incident positions of the first laser beam L1 and the second laser beam L2 to calculate the curvature (warp amount) of the substrate W. For example, a displacement amount of the incident position interval between the first laser beam L1 and the second laser beam L2 is calculated, and the curvature of the substrate W is calculated from this displacement interval.

Thereafter, when the curvature of the calculated substrate W is inputted to the control unit 11, the control unit 11 judges whether the inputted curvature of the substrate W has reached a predetermined set value, and when judged that the curvature of the substrate W measured by the curvature measuring device 10 has reached the predetermined set value, the control unit 11 stops the film forming process and further outputs the notification instruction to the notifier 12. Upon reception of the notification unit from the control unit 11, the notifier 12 notifies (warns) the user of the presence of a problem in warping of the substrate W.

The calculator 10*c* has, for example, a microcomputer having a processor and a storage device (both not illustrated) storing various programs and the like for calculating the curvature of the substrate W. This calculator 10*c* executes arithmetic processing for calculating the curvature of the substrate W based on the various programs stored in the storage device, and outputs the calculated curvature of the substrate W to the control unit 11. In addition, the calculator 10*c* can also be made of, for example, an application specific integrated circuit (ASIC), a circuit device, such as a programmable logic device, or the like.

As described above, according to the first embodiment, the first laser beam L1 and the second laser beam L2 are irradiated in parallel to the substrate W via the window 2*a* so that both the incident points A1 and A2 of the first laser beam L1 and the second laser beam L2 with respect to the long-shaped window 2*a* are substantially aligned in the long side direction of the window 2*a*. Since both the incident points A1 and A2 of the first laser beam L1 and the second laser beam L2 are thus aligned substantially in the long side direction in which a temperature gradient of the window 2*a* does not occur during film formation, the refractive indexes of the window 2*a* at positions of these incident points A1 and A2 become the same. Thus, it is possible to prevent a change in the incident position interval between the two laser beams L1 and L2 due to a difference in the refractive indexes. That is, it is possible to prevent a change in the incident position interval between the two laser beams L1 and L2 due to causes other than a warp of the substrate W, and hence the curvature measuring accuracy can be improved.

Incidentally, since the 2-point CCD method is to calculate the distance between two points by complicated image processing, it requires a high-speed computer, resulting in increased costs. On the other hand, if the processing speed is sacrificed for suppressing costs, the device performance decreases. Accordingly, when a PSD which outputs the center of gravity of distributions of incident laser beams as two electrical signals is used as the detector 10*b*, image processing is unnecessary, and it is just necessary to read in analog signals and execute simple calculations, such as basic arithmetic operations, which can prevent cost increase and device performance reduction.

Second Embodiment

A second embodiment will be explained with reference to FIG. 5. Note that differences (in the structure of a window 2*a*) of the second embodiment from the first embodiment are explained, and other explanations are omitted.

Figure 5:
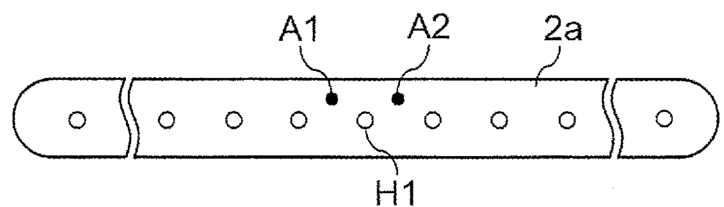
FIG. 5 is a plan view illustrating a window of a chamber and incident points of laser beams according to a second embodiment.

As illustrated in FIG. 5, a window 2*a* according to the second embodiment has a plurality of gas ports H1 for supplying gases into the chamber 2. These gas ports H1 are ports extending in a thickness direction of the window 2*a* and are aligned at predetermined intervals substantially in a center portion in a short side direction of the window 2*a* and substantially along a long side direction of the window 2*a*. The gas ports H1 are connected to a gas supply flow path (not illustrated) extending in the long side direction of the window 2*a*, and each discharge a gas flowing through this gas supply flow path to supply the gas into the chamber 2. Note that the gas supply flow path is formed in the window 2*a*, and one end or both ends thereof are connected to the gas supply part 3.

An incident point A1 of a first laser beam L1 is at a position separated by a predetermined distance from an edge of the window 2*a*, and is at equal distances from two gas ports H1 present around the incident point A1. Further, an incident point A2 of a second laser beam L2 is also at a position separated by the predetermined distance from the edge of the window 2*a*, and is at equal distances from two gas ports H1 present around the incident point A2. The predetermined distance is half the shortest separation distance between the edge of the window 2*a* and the gas ports H1.

At such positions of the incident points A1 and A2, the incident points A1 and A2 are not too close to the two gas ports H1, and are both separated by the same distance from the gas ports H1. Thus, even when a distortion, a temperature gradient, or the like occurs due to the presence of the gas ports H1 and the refractive index changes, refractive conditions (for example, degrees of distortions, temperatures, and so on), that is, refractive indexes at the positions of these incident points A1 and A2 are the same, and thus decrease in the curvature measurement accuracy can be prevented.

Further, the window 2*a* is difficult to be made with complete smoothness in its entire surface, and may hence have a defect, such as a looseness or a chip, in the edges.

However, since the incident points A1 and A2 are separated from the edges of the window 2a as described above, even when the refractive index changes due to a looseness, a chip, or the like in the edges, this change has no influence, and thus decrease in the curvature measuring accuracy can be prevented.

As described above, the second embodiment can exhibit similar effects to those of the above-described first embodiment. Even when the window 2a has a plurality of gas ports H1, the curvature measurement accuracy can be improved.

Modification Example 1 and Modification Example 2

Next, modification examples 1 and 2 of the positions of gas ports H1 according to the second embodiment will be explained with reference to FIG. 6 and FIG. 7.

Figure 6:
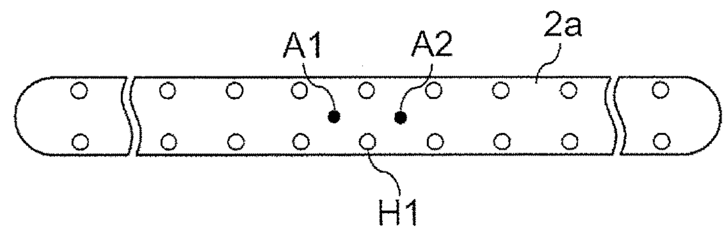
FIG. 6 is a plan view illustrating a window of a chamber and incident points of laser beams according to modification example 1 of the second embodiment.

In modification example 1, as illustrated in FIG. 6, the gas ports H1 are aligned at predetermined pitches (predetermined intervals) substantially along edges (an upper end and a lower end) in the long side direction of the window 2a, and are aligned also in the short side direction of the window 2a. These gas ports H1 are connected to a gas supply flow path (not illustrated) as in the second embodiment, and each discharge a gas flowing through this gas supply flow path to supply the gas into the chamber 2.

The incident point A1 of the first laser beam L1 is at a position at equal distances from four gas ports H1 present around the incident point A1. The incident point A2 of the second laser beam L2 also is at a position at equal distances from four gas ports H1 present around the incident point A2. Note that the gas ports H1 present around the incident point A1 or A2 is a plurality of gas ports H1 surrounding the incident point A1 or A2, which is four for the incident point A1 and four for the incident point A2 in modification example 1.

Figure 7:
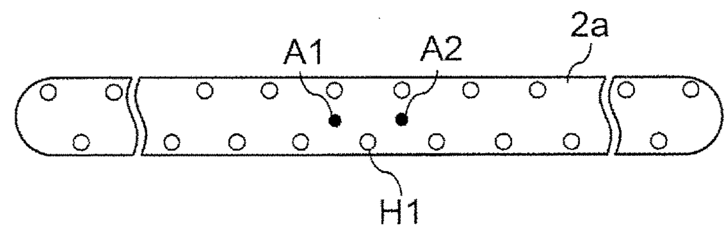
FIG. 7 is a plan view illustrating a window of a chamber and incident points of laser beams according to modification example 2 of the second embodiment.

In modification example 2, as illustrated in FIG. 7, the gas ports H1 are aligned at predetermined pitches (predetermined intervals) substantially along edges (an upper end and a lower end) in the long side direction of the window 2a, and moreover, an upper row and a lower row of the gas ports H1 are shifted by half pitch. These gas ports H1 are connected to a gas supply flow path (not illustrated) as in the second embodiment, and each discharge a gas flowing through this gas supply flow path to supply the gas into the chamber 2.

The incident point A1 of the first laser beam L1 is at a position at equal distances from three gas ports H1 present around the incident point A1. The incident point A2 of the second laser beam L2 also is at a position at equal distances from three gas ports H1 present around the incident point A2. Note that the gas ports H1 present around the incident point A1 or A2 is a plurality of gas ports H1 surrounding the incident point A1 or A2, which is three for the incident point A1 and three for the incident point A2 in modification example 1.

To summarize the structures of the window 2a illustrated in FIG. 6 and FIG. 7, it can be said that the window 2a has a plurality of gas ports H1 for supplying a gas to the inside of the chamber 2, the incident point A1 of the first laser beam L1 is at a position separated from the edge of the window 2a and is at equal distances from two or more gas ports H1 present around this incident point A1, and the incident point A2 of the second laser beam L2 is at a position separated from the edge of the window 2a and is at equal distances from two or more gas ports H1 present around this incident point A2.

At such positions of the incident points A1 and A2 according to modification example 1 or modification example 2, similarly to the second embodiment, the incident points A1 and A2 are not too close to the four or three gas ports H1, and are both separated by the same distance from the gas ports H1. Thus, even when a distortion, a temperature gradient, or the like occurs due to the presence of the gas ports H1 and the refractive index changes, refractive conditions (for example, degrees of distortions, temperatures, and so on), that is, refractive indexes at the positions of these incident points A1 and A2 are the same, and thus decrease in the curvature measurement accuracy can be prevented. Moreover, the incident points A1 and A2 are separated from the edge of the window 2a, and even when the refractive index changes due to a looseness, a chip, or the like in the edges, this change has no influence, and thus decrease in the curvature measuring accuracy can be prevented.

OTHER EMBODIMENTS

In the above-described first and second embodiments, although the first laser beam L1 and the second laser beam L2 in parallel are generated by the laser beam outputting unit, the beam splitter, the mirror, and so on as the irradiator 10a, note that this is not restrictive, and for example, the first laser beam L1 and the second laser beam L2 in parallel may be generated by using two laser beam outputting units.

Further, in the above-described first and second embodiments, although warping of the substrate W is measured by the curvature measuring device 10, note that this is not restrictive, and for example, other than warping thereof, the curvature may be applied to measurement of an inclination, a height position, and the like of the substrate W.

Further, in the above-described first and second embodiments, although the shower plate 4 and the curvature measuring device 10 are not cooled, note that this is not restrictive, and for example, the shower plate 4, the curvature measuring device 10, and so on may be cooled with a cooling device.

Further, in the above-described first and second embodiments, although film formation by MOCVD or the like is exemplified as a main application example, when there is a possibility that a warp change of the substrate W accompanying film formation occurs, it is not limited to MOCVD and application to methods such as sputtering and vapor deposition is possible, and moreover, it is not limited to film formation and application to measurement of general warping is possible.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate processing apparatus, comprising:

a process chamber into which a substrate to be processed is loaded;

a long-shaped window provided on the process chamber;

an irradiator provided outside the process chamber and the irradiator being configured to irradiate a first laser beam and a second laser beam to the substrate in the process chamber via the long-shaped window in a manner that an incident point of the first laser beam and an incident point of the second laser beam with respect to the window are aligned substantially along a long side direction of the window;

a detector configured to have a light reception surface receiving the first laser beam and the second laser beam which are reflected by the substrate and passing through the window, the detector being configured to detect incident positions of the first laser beam and the second laser beam on the light reception surface; and a calculator configured to calculate a curvature of the substrate by using a relative position of the first laser beam and the second laser beam which are detected by the detector.

2. The substrate processing apparatus of claim 1, wherein a direction in which both the incident points of the first laser beam and the second laser beam are aligned is substantially orthogonal to a short side direction in which a temperature gradient occurs in the window.

3. The substrate processing apparatus of claim 1, wherein the detector is a plurality of one-dimensional position detecting elements, that light receiving elements are disposed to be aligned substantially along the long side direction of the window.

4. The substrate processing apparatus of claim 1, wherein the detector is a two-dimensional position detecting element, and the calculator calculates a curvature of the substrate by using a component in the long side direction of the window at an incident position of the first laser beam detected by the detector and a component in the long side direction of the window at an incident position of the second laser beam detected by the detector.

5. The substrate processing apparatus of claim 1, wherein the window is provided in a shower plate that gas flow paths in which gases used for processing the substrate flow are formed.

6. The substrate processing apparatus of claim 1, wherein the window has a plurality of gas ports configured to supply gases to the process chamber, the incident point of the first laser beam is at a position separated from an edge of the window and at substantially equal distances from two or more of the gas ports which are present around the incident point, and the incident point of the second laser beam is at a position separated from an edge of the window and at substantially equal distances from two or more of the gas ports which are present around the incident point.

7. The substrate processing apparatus of claim 6, wherein the incident point of the first laser beam is located at a distance which is approximately half a shortest separation distance between the edge of the window and the gas ports.

8. The substrate processing apparatus of claim 1, wherein the first laser beam and the second laser beam are laser beams with a wavelength between 500 nm or more and 540 nm or less.

9. The substrate processing apparatus of claim 1, further comprising a control unit configured to judge whether a curvature of the substrate calculated by the calculator has reached a predetermined value, and the control unit configured to stop processing of the substrate when the control unit judged that the curvature of the substrate has reached the predetermined value.

10. The substrate processing apparatus of claim 9, further comprising a notifier configured to notify that the curvature of the substrate has reached the predetermined value based on an instruction from the control unit.

* * * * *